United States Patent
Bai et al.

(10) Patent No.: US 11,800,740 B2
(45) Date of Patent: Oct. 24, 2023

(54) DISPLAY PANEL, METHOD FOR MANUFACTURING SAME, AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Nini Bai, Beijing (CN); Liangliang Liu, Beijing (CN); Liman Peng, Beijing (CN)

(73) Assignees: ORDOS YUANSHENG OPTOELECTRONICS CO., LTD. and BOE TECHNOLOGY GROUP CO., LTD., Ordos (CN); BOE TECHNOLOGY GROUP CO., LTD., Beijing (CN)

( * ) Notice: Subject to any disclaimer, the term of this patent is extended or adjusted under 35 U.S.C. 154(b) by 182 days.

(21) Appl. No.: 17/345,026

(22) Filed: Jun. 11, 2021

(65) Prior Publication Data

US 2021/0408478 A1 Dec. 30, 2021

(30) Foreign Application Priority Data

Jun. 29, 2020 (CN) .......................... 202010603904.9

(51) Int. Cl.
| H10K 50/844 | (2023.01) |
| H10K 50/842 | (2023.01) |
| H10K 59/122 | (2023.01) |
| H10K 71/00 | (2023.01) |

(52) U.S. Cl.
CPC ....... *H10K 50/844* (2023.02); *H10K 50/8426* (2023.02); *H10K 59/122* (2023.02); *H10K 71/00* (2023.02)

(58) Field of Classification Search
CPC .. H01L 27/3276–3279; H01L 27/3297; G09G 3/3233–3258; G09G 2300/0408; H10K 50/844; H10K 50/8426; H10K 59/122; H10K 71/00
See application file for complete search history.

(56) References Cited

U.S. PATENT DOCUMENTS

| 2011/0234568 | A1* | 9/2011 | Izumida | H01L 27/124 345/211 |
| 2018/0158741 | A1* | 6/2018 | Kim | H01L 22/34 |
| 2018/0188568 | A1* | 7/2018 | Kim | H01L 29/7869 |
| 2018/0342564 | A1* | 11/2018 | Hanari | H01L 51/524 |
| 2020/0312919 | A1* | 10/2020 | Zhang | H01L 51/5237 |
| 2021/0066418 | A1* | 3/2021 | Seo | H01L 51/0017 |
| 2021/0126075 | A1* | 4/2021 | Wang | H01L 27/3276 |

* cited by examiner

*Primary Examiner* — Shaun M Campbell
(74) *Attorney, Agent, or Firm* — Lippes Mathias LLP

(57) ABSTRACT

A display panel includes a substrate. The substrate includes a display area, an encapsulation area, and a peripheral area between the display area and the encapsulation area. The peripheral area comprises a signal transmission layer disposed on the substrate, a protruding structure disposed on the signal transmission layer, and a first electrode layer covering a surface of the protruding structure. The first electrode layer is electrically connected to the signal transmission layer.

17 Claims, 6 Drawing Sheets

DISPLAY PANEL, METHOD FOR MANUFACTURING SAME, AND DISPLAY DEVICE

CROSS REFERENCE TO RELATED APPLICATION

This application claims priority to Chinese Patent Application No. 202010603904.9, filed on Jun. 29, 2020 and entitled "DISPLAY PANEL, METHOD FOR MANUFACTURING SAME, AND DISPLAY DEVICE", the entire content of which is incorporated herein by reference.

TECHNICAL FIELD

The present disclosure relates to the field of display technologies, and in particular, to a display panel, a method for manufacturing the same, and a display device.

BACKGROUND

Currently, a rigid organic light-emitting diode (OLED) display panel generally has an AA area (display area), an encapsulation area, and a peripheral area disposed between the AA area and the encapsulation area. Frit is usually used for encapsulation in the encapsulation area.

SUMMARY

The present disclosure provides a display panel. The display panel includes: a substrate, wherein the substrate includes a display area, an encapsulation area surrounding the display area, and a peripheral area disposed between the display area and the encapsulation area; a signal transmission layer disposed in the peripheral area of the substrate; a protruding structure disposed on the signal transmission layer; and a first electrode layer that covers the protruding structure and is electrically connected to the signal transmission layer.

Optionally, the protruding structure includes a planarization layer covering the signal transmission layer, wherein the planarization layer has a first hole, and the first electrode layer is connected to the signal transmission layer via the first hole.

Optionally, the protruding structure further includes any one of the followings: a pixel defining layer disposed on the planarization layer; a support layer disposed on the planarization layer; or a pixel defining layer and a support layer that are laminated on the planarization layer.

Optionally, the peripheral area is further provided with a second electrode layer, wherein the second electrode layer is disposed on the planarization layer, the second electrode layer is at least partially disposed in the first hole, and the second electrode layer is connected to the signal transmission layer, and the first electrode layer covers the second electrode layer.

Optionally, the protruding structure includes a planarization layer, a pixel defining layer, and a support layer, wherein the planarization layer covers the signal transmission layer; the planarization layer is covered by a second electrode layer, wherein the second electrode layer is connected to the signal transmission layer via a first hole in the planarization layer, and the second electrode layer has a second hole exposing the planarization layer; the pixel defining layer and the support layer are laminated in the second hole; and the first electrode layer covers the second electrode layer, the pixel defining layer, and the support layer.

Optionally, the signal transmission layer has a plurality of third holes, and the third holes are filled with the planarization layer.

Optionally, the signal transmission layer is of a grid structure, and meshes of the grid structure form the third holes.

Optionally, a ratio of an absolute value of a difference between a height of the peripheral area and a height of the encapsulation area to the height of the encapsulation area is less than or equal to 10%.

Optionally, an insulating layer is disposed between the signal transmission layer and the substrate.

Optionally, the first electrode layer disposed in the peripheral area is electrically connected to a first electrode layer disposed in the display area.

Optionally, the display area is provided with an active layer, a first insulating layer, a gate layer, a second insulating layer, a signal transmission layer, a planarization layer, a second electrode layer, a pixel defining layer, a support layer, and a first electrode layer that are sequentially laminated on the substrate, wherein an organic light-emitting layer is disposed between the second electrode layer and the first electrode layer.

Optionally, the encapsulation area is provided with a first insulating layer, a gate layer, a second insulating layer, and sealant that are laminated on the substrate.

The present disclosure further provides a method for manufacturing a display panel. The method includes: providing a substrate, wherein the substrate includes a display area, an encapsulation area surrounding the display area, and a peripheral area disposed between the display area and the encapsulation area; forming a signal transmission layer in the peripheral area of the substrate; forming a protruding structure on the signal transmission layer; and forming a first electrode layer that covers the protruding structure and is electrically connected to the signal transmission layer.

Optionally, the protruding structure includes a planarization layer, a pixel defining layer, and a support layer, and the forming the protruding structure on the signal transmission layer includes: forming the planarization layer on the signal transmission layer, and forming, in the planarization layer, a plurality of first holes exposing the signal transmission layer; forming a second electrode layer on the planarization layer, wherein the second electrode layer covers the planarization layer and surfaces of the first holes, and the second electrode layer is connected to the signal transmission layer; forming a second hole in the second electrode layer, to expose the planarization layer; and sequentially forming the pixel defining layer and the support layer in the second hole.

The present disclosure further provides a display device. The display device includes a display panel. The display panel includes: a substrate, wherein the substrate includes a display area, an encapsulation area surrounding the display area, and a peripheral area disposed between the display area and the encapsulation area; a signal transmission layer disposed in the peripheral area of the substrate; a protruding structure disposed on the signal transmission layer; and a first electrode layer that covers the protruding structure and is electrically connected to the signal transmission layer.

Optionally, the protruding structure includes a planarization layer covering the signal transmission layer, wherein the planarization layer has a first hole, and the first electrode layer is connected to the signal transmission layer via the first hole.

Optionally, the protruding structure further includes any one of the followings: a pixel defining layer disposed on the planarization layer; a support layer disposed on the planarization layer; or a pixel defining layer and a support layer that are laminated on the planarization layer.

Optionally, the peripheral area is further provided with a second electrode layer, wherein the second electrode layer is disposed on the planarization layer, the second electrode layer is at least partially disposed in the first hole, and the second electrode layer is connected to the signal transmission layer, and the first electrode layer covers the second electrode layer.

Optionally, the protruding structure includes a planarization layer, a pixel defining layer, and a support layer, wherein the planarization layer covers the signal transmission layer; the planarization layer is covered by a second electrode layer, wherein the second electrode layer is connected to the signal transmission layer via a first hole in the planarization layer, and the second electrode layer has a second hole exposing the planarization layer; the pixel defining layer and the support layer are laminated in the second hole; and the first electrode layer covers the second electrode layer, the pixel defining layer, and the support layer.

Optionally, the signal transmission layer has a plurality of third holes, and the third holes are filled with the planarization layer.

DETAILED DESCRIPTION

The present disclosure will be further described in detail below with reference to the accompanying drawings and embodiments. It is to be understood that the specific embodiments described herein are merely used to explain the present disclosure, but not used to limit the present disclosure. In addition, it should be noted that, for ease of description, only parts related to the present disclosure are shown in the accompanying drawings.

Words "first", "second", and the like used in the present disclosure are merely used to distinguish different parts, instead of indicating any particular order, quantity, or importance. Words "include", "comprise", and the like indicate that an element before the word covers elements listed after the word, without precluding the possibility of covering other elements. Words "on", "under", "left", "right", "inside", "outside", "top", "bottom", and the like are merely used to indicate relative location relationships. When an absolute location of an described object changes, its relative location relationship may also change accordingly.

Figure 1:
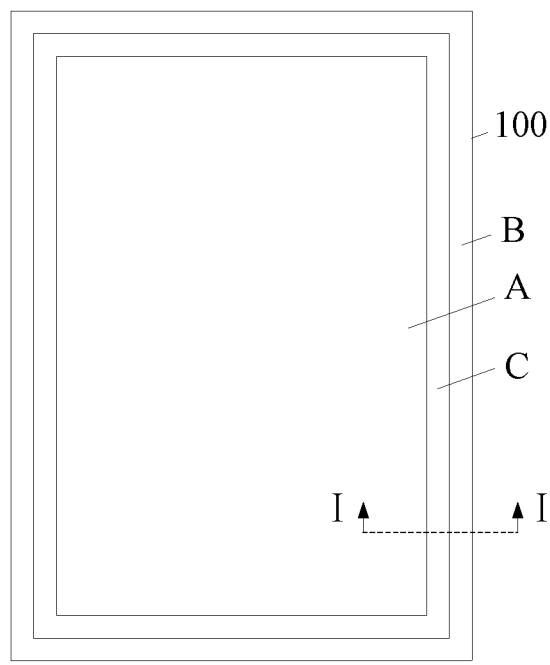
FIG. 1 is a top view of a display panel according to an embodiment of the present disclosure.

FIG. 1 is a top view of a display panel according to an embodiment of the present disclosure. As shown in FIG. 1, the display panel includes a substrate 100. The substrate 100 includes a display area A, an encapsulation area B surrounding the display area A, and a peripheral area C disposed between the display area A and the encapsulation area B. The display area A of the substrate 100 is an area that is to be manufactured for picture display of the display panel on the substrate 100. The encapsulation area B of the substrate 100 is an area on which sealant is to be disposed, on the substrate 100. The encapsulation area B surrounds the display area A. The substrate 100 includes a spacing area between the display area A and the encapsulation area B, and the spacing area is the peripheral area C of the substrate 100.

Figure 2:
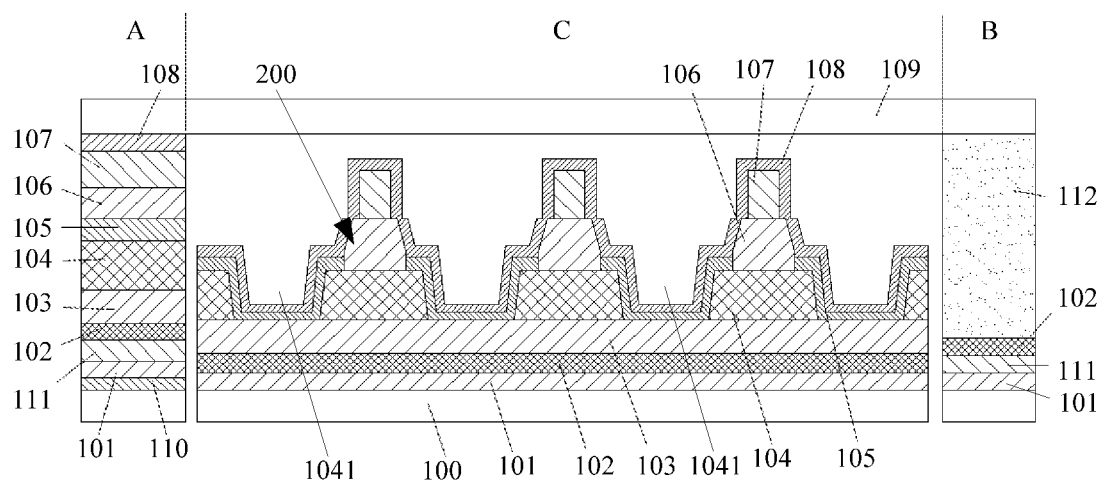
FIG. 2 is a sectional view of I-I in FIG. 1.

FIG. 2 is a sectional view of I-I in FIG. 1. As shown in FIG. 2, the display area A is provided with an active layer 110, a first insulating layer 101, a gate layer 111, a second insulating layer 102, a signal transmission layer 103, a planarization layer 104, a second electrode layer 105, a pixel defining layer 106, a support layer 107, and a first electrode layer 108 that are sequentially laminated on the substrate 100. A plurality of organic light-emitting layers are disposed between the second electrode layer 105 and the first electrode layer 108, and the plurality of organic light-emitting layers are distributed in an array.

The first electrode layer 108 is one of a cathode and an anode, and the second electrode layer 105 is the other one of a cathode and an anode. This embodiment of the present disclosure is illustrated by taking an example in which the first electrode layer 108 is a cathode and the second electrode layer 105 is an anode.

The encapsulation area B is provided with a first insulating layer 101, a gate layer 111, a second insulating layer 102, and sealant 112 that are laminated on the substrate 100. The display panel further includes a cover plate 109. The cover plate 109 is connected to the substrate 100 via the sealant 112.

As shown in FIG. 2, the display panel includes: a signal transmission layer 103 disposed in the peripheral area C of the substrate 100, a protruding structure 200 disposed on the signal transmission layer 103, and a first electrode layer 108 covering the protruding structure 200. The first electrode layer 108 is electrically connected to the signal transmission layer 103.

The height of the display panel in the display area A and the height of the display panel in the encapsulation area B differ slightly, and are approximately the same. "Height" in this embodiment of the present disclosure refers to the maximum vertical distance to a surface, which is configured to bear the signal transmission layer 103, of the substrate 100. The surface of the display panel away from the substrate 100 is uneven in the display area A, the encapsulation area B, and the peripheral area C. For example, as shown in FIG. 2, the surface, which is configured to bear the signal transmission layer 103, of the substrate 100 is the upper surface of the substrate 100. The upper surface of the first electrode layer 108, that is the surface, away from the substrate 100, of the first electrode layer 108 is uneven, such that the vertial distance between the upper surface of the first electrode layer 108 and the upper surface of the substrate 100 is different at different positions of the peripheral area C. The height of the peripheral area C is the maximum distance among the different vertial distances, that is the maximum vertial distance between the upper surface of the first electrode layer 108 and the upper surface of the substrate 100. In the related art, the heights of the display panel in the peripheral area C and the encapsulation area B differ greatly, which causes Newton's rings easily on the front side of the display panel. At present, Newton's ring is mainly improved by the height of frit coating. For each product, adjustment of frit coting height and laser irradiation are performed for test verification. Generally, at least 2 to 3 verifications are required to find optimally matched process conditions. The verification period is long, and the cost is high. In this embodiment of the present disclosure, by disposing the protruding structure 200 in the peripheral area C, the difference between heights of the display panel in the peripheral area C and the encapsulation area B is reduced, which can reduce the risk of occurrence of Newton's rings on the display panel, reduce the times of glue coating tests during encapsulation of the display panel. Thus, labor and time costs are reduced, and the efficiency is improved.

The signal transmission layer 103 disposed in the peripheral area C and the signal transmission layer 103 disposed in the display area A are on the same layer, that is, they are formed by the same film layer through a patterning process. The signal transmission layer 103 disposed in the peripheral area C and the signal transmission layer 103 disposed in the display area A are insulated from each other, and are configured to provide electrical signals to the organic light-emitting layers in the display area A, such that the organic light-emitting layers emit light.

The first electrode layer 108 disposed in the peripheral area C is electrically connected to the first electrode layer 108 disposed in the display area A, such that electrical signals can be input to the first electrode layer 108 in the display area A by the signal transmission layer 103 disposed in the peripheral area C. In this embodiment of the present disclosure, the first electrode layer 108 in the peripheral area C and the first electrode layer 108 in the display area A are on the same layer, that is, they are formed by the same film layer through a patterning process. Therefore, the manufacturing process is simpler.

As shown in FIG. 2, the protruding structure 200 includes a planarization layer 104 covering the signal transmission layer 103. The planarization layer 104 has a first hole 1041. The first electrode layer 108 is connected to the signal transmission layer 103 via the first hole 1041. The first hole 1041 exposes the signal transmission layer 103, so that the first electrode layer 108 disposed on the planarization layer 104 can be directly or indirectly connected to the signal transmission layer 103.

The planarization layer 104 disposed in the peripheral area C and the planarization layer 104 disposed in the display area A are of a same-layer structure. During manufacture of a display panel, a planarization layer 104 is formed only in the display area A in the related art. However, in this embodiment of the present disclosure, the planarization layers 104 are formed in both the display area A and the peripheral area C, and the protruding structure 200 is formed by means of the planarization layer 104, which changes slightly the process for manufacturing a display panel. Therefore, the manufacture is convenient and efficient, and the cost is low.

As shown in FIG. 2, the peripheral area C is further provided with a second electrode layer 105. The second electrode layer 105 is disposed on the planarization layer 104, the second electrode layer 105 is at least partially disposed in the first hole 1041, and the second electrode layer 105 is connected to the signal transmission layer 103. The first electrode layer 108 covers the second electrode layer 105.

The second electrode layer 105 disposed in the peripheral area C and the second electrode layer 105 disposed in the display area A are on the same layer, that is, they are formed by the same film layer through a patterning process. The second electrode layer 105 disposed in the peripheral area C and the second electrode layer 105 disposed in the display area A are insulated from each other. In the peripheral area C, the second electrode layer 105 is connected to the signal transmission layer 103 and the first electrode layer 108. By disposing the second electrode layer 105, the height of the peripheral area C is increased, which helps improve the flatness of the first electrode layer 108.

Optionally, the protruding structure 200 further includes at least one of a pixel defining layer 106 and a support layer 107. For example, in some examples, the protruding structure 200 further includes a pixel defining layer 106 disposed on the planarization layer 104. In some other examples, the protruding structure 200 further includes a support layer 107 disposed on the planarization layer 104. In some still other examples, the protruding structure 200 further includes a pixel defining layer 106 and a support layer 107 that are laminated on the planarization layer 104.

The pixel defining layer 106 disposed in the peripheral area C and the pixel defining layer 106 disposed in the display area A are of a same-layer structure. The support layer 107 disposed in the peripheral area C and the support layer 107 disposed in the display area A are of a same-layer structure. During manufacture of a display panel, the pixel defining layer 106 and the support layer 107 are formed only in the display area A in the related art. In the embodiment of the present disclosure, at least one of the pixel defining layer 106 and the support layer 107 is also formed in the peripheral area C. By laminating at least one of the pixel defining layer 106 and the support layer 107 on the planarization layer 104, the height of the protruding structure 200 increases, which further reduces the difference between heights of the peripheral area C and the encapsulation area B of the display panel, and reduces the possibility of generating Newton's rings. In addition, by adopting the planarization layer 104, the pixel defining layer 106, and the support layer 107 to form the protruding structure 200, the change in the process for manufacturing a display panel is relatively small. Therefore, the manufacture is convenient, the efficiency is high, and the cost is low.

Figure 3:
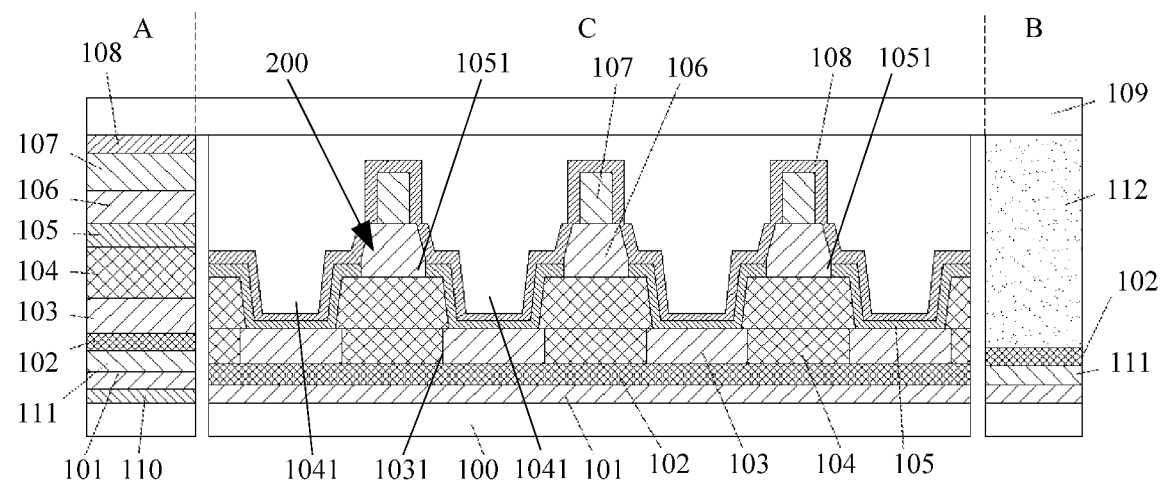
FIG. 3 is a schematic structural diagram of a display panel according to an embodiment of the present disclosure.

FIG. 3 is a schematic structural diagram of a display panel according to an embodiment of the present disclosure. As shown in FIG. 3 (FIG. 3 only displays a display area A partially. To display a specific structure, a schematic diagram is adopted for illustration, and drawing is not based on an actual scale), a substrate 100 of the display panel includes a display area A, an encapsulation area B surrounding the display area A, and a peripheral area C between the display area A and the encapsulation area B. In the peripheral area C, the protruding structure 200 includes a planarization layer 104, a pixel defining layer 106, and a support layer 107. The planarization layer 104 covers a signal transmission layer 103. A second electrode layer 105 covers the planarization layer 104. The second electrode layer 105 covers is connected to the signal transmission layer 103 via a first hole 1041 in the planarization layer 104, and has a second hole 1051 exposing the planarization layer 104. The pixel defining layer 106 and the support layer 107 are laminated in the second hole 1051.

The first electrode layer 108 covers the second electrode layer 105, the pixel defining layer 106, and the support layer 107 (Under the case that the support layer 107 cannot completely cover the pixel defining layer 106, the first electrode layer 108 covers both the support layer 107 and the pixel defining layer 106).

In the peripheral area C, the signal transmission layer 103 provides voltage for the first electrode layer 108 through the second electrode layer 105. As the first electrode layer 108 disposed in the peripheral area C is connected to the first electrode layer 108 disposed in the display area A, power can be supplied to the first electrode layer 108 of the display area A.

By disposing the planarization layer 104, the pixel defining layer 106, and the support layer 107 in the peripheral area C, compared with the prior art, the height of the peripheral area C is more approximate to that of the encapsulation area B, which greatly reduces the risk of generating Newton's rings, avoids the process of repeated glue coating tests. Thus, labor and time costs are reduces, and the efficiency is improved.

Optionally, the ratio of the absolute value of the difference between the height of the peripheral area C and the height of the encapsulation area B to the the height of the encapsulation area B is less than or equal to 10%. For example, the ratio of the absolute value of the difference between the height of the peripheral area C and the height of the encapsulation area B to the the height of the encapsulation area B is less than or equal to 5%. In this embodiment of the present disclosure, the height of the peripheral area C is the same as that of the encapsulation area B. At least one of the heights of the planarization layer 104, the pixel defining layer 106, and the support layer 107 can be adjusted, so that the integral height of the display panel in the peripheral area C is approximate to or matches that in the encapsulation area B.

In some examples, the substrate 100 is a glass substrate.

In some examples, an insulating layer is disposed between the signal transmission layer 103 and the substrate 100. Optionally, the insulating layer includes a first insulating layer 101 or a second insulating layer 102, or includes a first insulating layer 101 and a second insulating layer 102 that are laminated.

In some examples, the display area A is provided with an active layer 110, a first insulating layer 101, a gate layer 111, a second insulating layer 102, a signal transmission layer 103, a planarization layer 104, a second electrode layer 105, a pixel defining layer 106, a support layer 107, and a first electrode layer 108 that are sequentially laminated on the substrate 100. An organic light-emitting layer (not shown in the figure) is disposed between the second electrode layer 105 and the first electrode layer 108.

In some examples, the encapsulation area B is provided with a first insulating layer 101, a gate layer 111, a second insulating layer 102, and sealant 112 that are laminated on the substrate 100.

The first electrode layer 108 in the peripheral area C is electrically connected to the first electrode layer disposed in the display area A. The signal transmission layer 103 and the second electrode layer 105 in the peripheral area C are not connected to the signal transmission layer 103 and the second electrode layer 105 in the display area A.

The display panel further includes a cover plate 109. The cover plate 109 is connected to the substrate 100 via the sealant 112.

Figure 4:
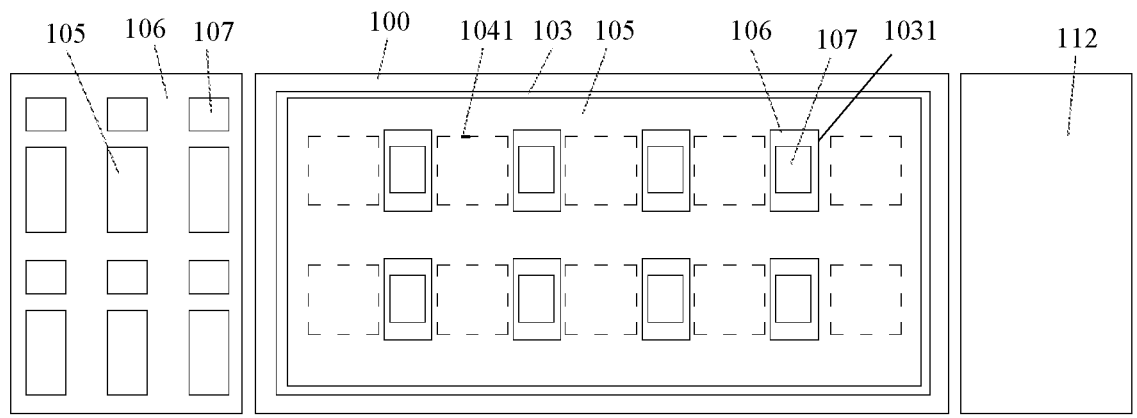
FIG. 4 is an enlarged top view (excluding a cover plate and a first electrode layer) of a display panel according to an embodiment of the present disclosure.

In some examples, as shown in FIGS. 3 and 4, the signal transmission layer 103 has a plurality of third holes 1031, and the third holes 1031 are filled with the planarization layer 104. The process of manufacturing a display panel is easily affected by static electricity. For example, when the second electrode layer 105 is manufactured, static electricity may be generated, resulting in that the signal transmission layer 103 or the second electrode layer 105 breaks down due to the static electricity. By forming a plurality of holes in the signal transmission layer 103, the area of the signal transmission layer 103 is reduced, which can reduces the possibility of electro-static discharge (ESD), thereby reducing the probability of damaging the display panel and improving the yield.

In some examples, the signal transmission layer 103 is of a grid structure, and meshes of the grid structure form the third holes 1031. In some other examples, a plurality of meshes of the grid structure are uniformly distributed.

In some examples, the meshes are squares with sides being 5 to 7 micrometers, and widths of the grid lines are 5 to 7 micrometers. In some other examples, the meshes are rectangles, circles, or other polygons.

By setting the signal transmission layer 103 to be of a grid structure, an effective area of the signal transmission layer 103 is greatly reduced, which effectively avoids ESD and reduces the probability of damaging the display panel.

The present disclosure further provides a display device, including any one of the display panels described above. The display device may be any device with a display function. For example, the display device may be, but is not limited to, a mobile phone, a tablet computer, or a notebook computer.

A method for manufacturing a display panel in the present disclosure is illustrated hereinafter with reference to FIGS. 5 to 11 (The figures focus on the process for manufacturing a peripheral area, but do not show the processes for manufacturing a display area and an encapsulation area, which adopt the solutions in the prior art).

Figure 5:
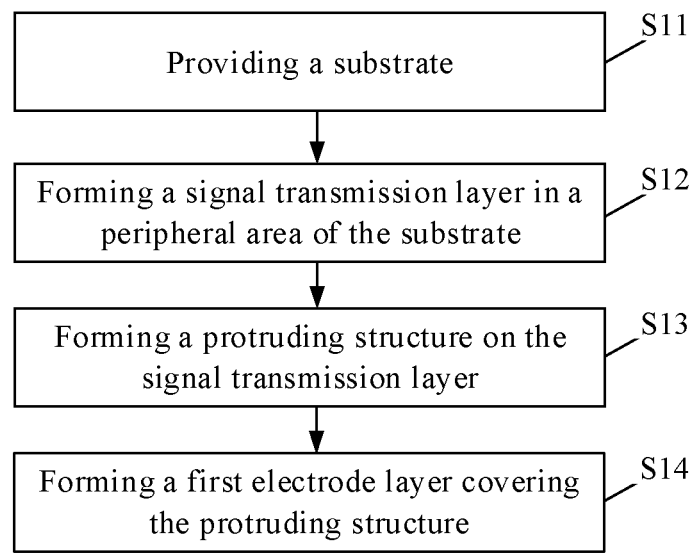
FIG. 5 is a flowchart of a method for manufacturing a display panel according to an embodiment of the present disclosure.

As shown in FIG. 5, the method includes:

In step S11, a substrate is provided.

The substrate includes a display area, an encapsulation area surrounding the display area, and a peripheral area disposed between the display area and the encapsulation area.

In step S12, a signal transmission layer is formed in the peripheral area of the substrate.

Figure 6:
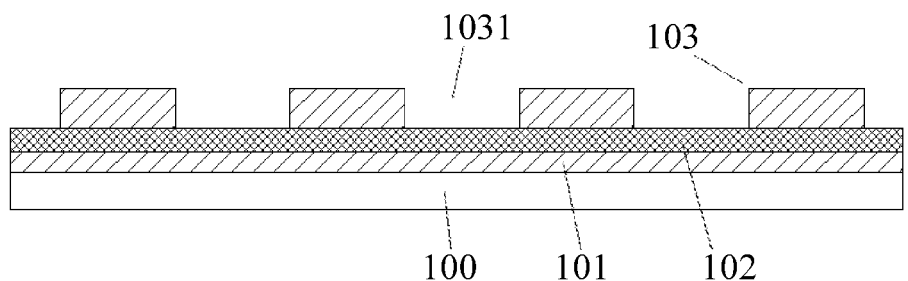
FIG. 6 is a process digram of forming a signal transmission layer on a substrate according to an embodiment of the present disclosure.

As shown in FIG. 6, a signal transmission layer 103 is formed in the peripheral area. Optionally, before the signal transmission layer 103 is formed, an insulating layer is formed on the substrate 100. The insulating layer may include a first insulating layer 101, or a second insulating layer 102, or a first insulating layer 101 and a second insulating layer 102 that are laminated.

In some examples, the signal transmission layer 103 is a coating film, and may be manufactured by evaporation, sputtering, electroplating, and the like. In the case that the signal transmission layer 103 has third holes 1031, the third holes 1031 are formed by performing exposure, etching, and peeling on the coating film.

In step S13, a protruding structure is formed on the signal transmission layer.

In this embodiment of the present disclosure, the protruding structure includes a planarization layer, a pixel defining layer, and a support layer.

Figure 7:
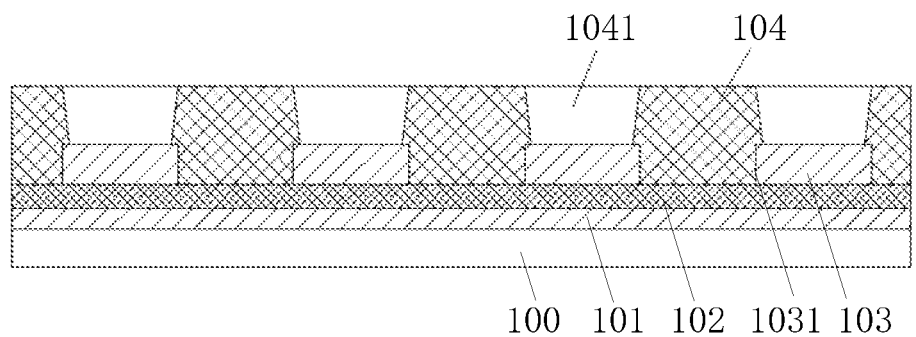
FIG. 7 is a process digram of forming a planarization layer according to an embodiment of the present disclosure.

As shown in FIG. 7, a planarization layer 104 is formed on the signal transmission layer 103, and a plurality of first holes 1041 are formed in the planarization layer 104 to expose the signal transmission layer 103. In the case that the signal transmission layer 103 has third holes 1031, the third holes 1031 are filled with the planarization layer 104.

Figure 8:
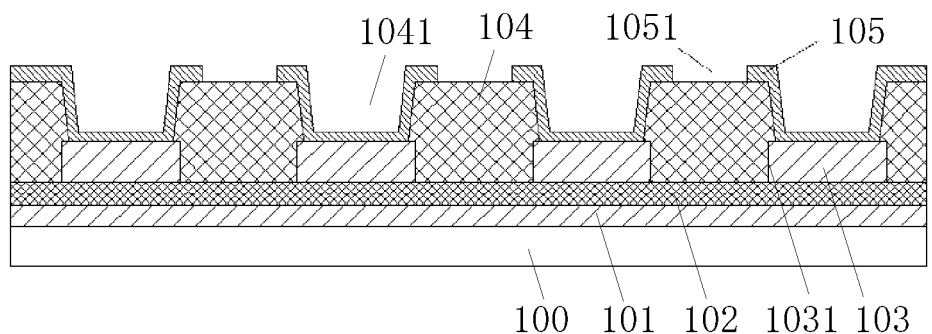
FIG. 8 is a process digram of forming a second electrode layer according to an embodiment of the present disclosure.

As shown in FIG. 8, a second electrode layer 105 is formed on the planarization layer 104.

Optionally, the second electrode layer 105 is a coating film, and may be manufactured by evaporation, sputtering, electroplating, and the like. The second electrode layer 105 covers the planarization layer 104 and the surfaces of the first hole 1041, so as to be connected to the signal transmission layer 103.

Subsequently, second holes 1051 are formed partially in the second electrode layer 105, to expose the exposing the planarization layer 104 under the second electrode layer 105.

Optionally, the second hole 1051 is formed via exposure, etching, and stripping.

Figure 9:
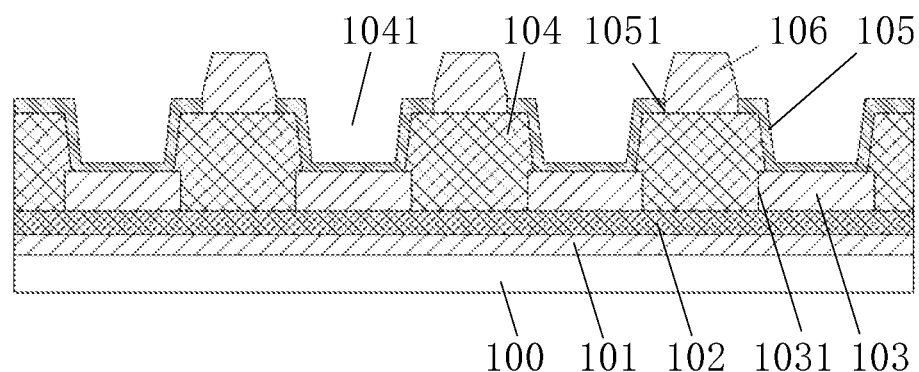
FIG. 9 is a process digram of forming a pixel defining layer according to an embodiment of the present disclosure.
Figure 10:
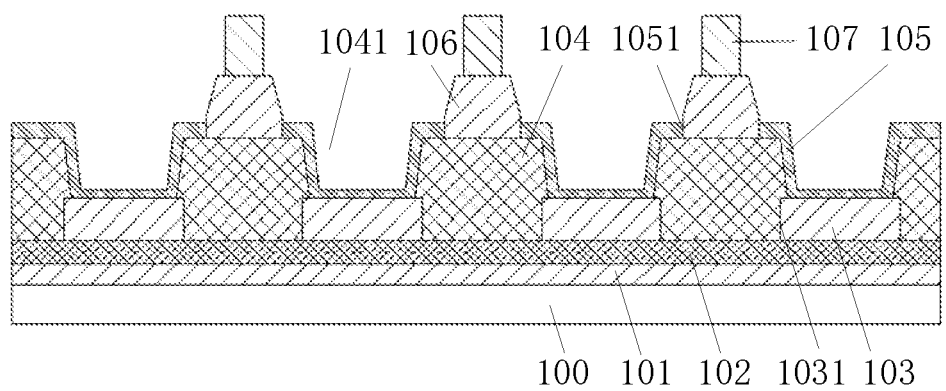
FIG. 10 is a process digram of forming a support layer according to an embodiment of the present disclosure.

As shown in FIGS. 9 and 10, a pixel defining layer 106 is formed in the second hole 1051. Then, a support layer 107 is formed on the pixel defining layer 106. Both the pixel defining layer 106 and the support layer 107 are manufactured by exposure and curing.

Figure 12:
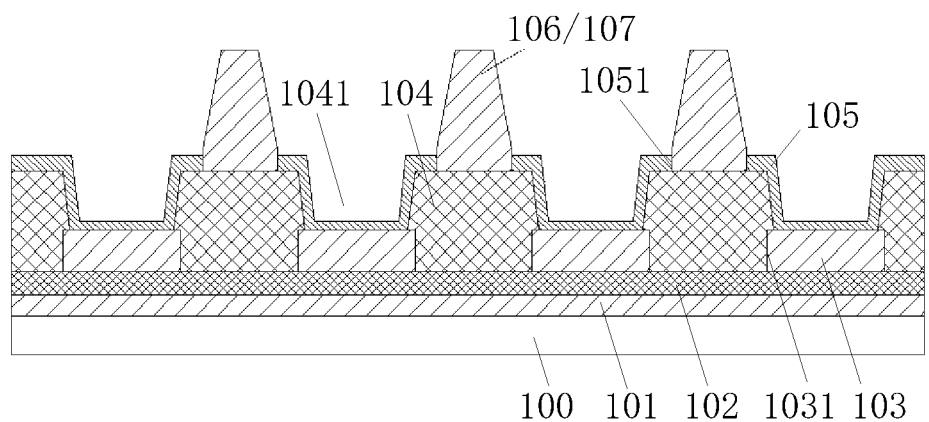
FIG. 12 is a process digram of forming a pixel defining layer/support layer according to an embodiment of the present disclosure.

As shown in FIG. 12, in an example, only a pixel defining layer 106 or a support layer 107 is formed in the second hole 1051. In this case, the height of the pixel defining layer 106 or the height of the support layer 107 is approximate to the total height of the pixel defining layer 106 and the support layer 107 in FIG. 10.

In step S14, a first electrode layer 108 covering the protruding structure 200 is formed.

Figure 11:
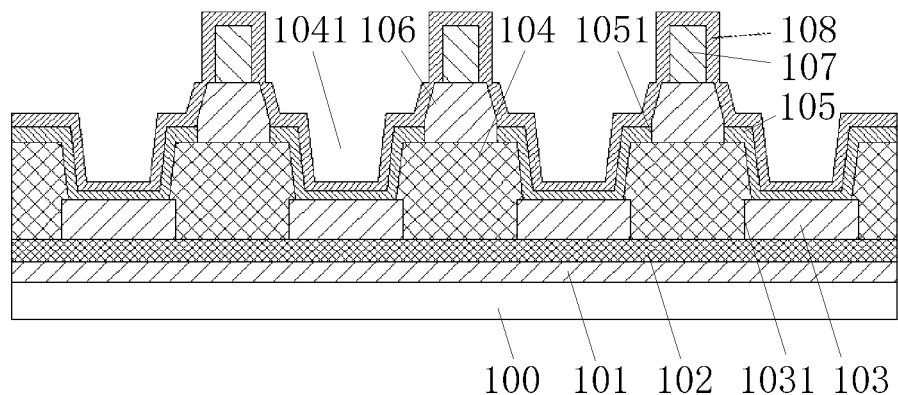
FIG. 11 is a process digram of forming a first electrode layer according to an embodiment of the present disclosure.

The first electrode layer 108 is electrically connected to the signal transmission layer 103. As shown in FIG. 11, the first electrode layer 108 is formed on the surfaces of the second electrode layer 105, the pixel defining layer 106, and the support layer 107 (If the support layer 107 completely covers the surface of the pixel defining layer 106, the first electrode layer 108 only covers the second electrode layer 105 and the support layer 107). The first electrode layer 108 is a coating film, and may be manufactured by evaporation, sputtering, electroplating, and the like.

Figure 13:
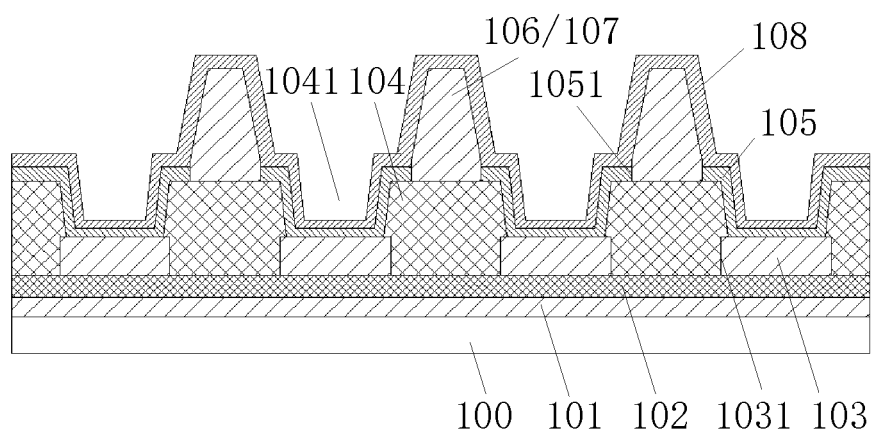
FIG. 13 is a process digram of forming a first electrode layer according to an embodiment of the present disclosure.

As shown in FIG. 13, in an example in which only one of a pixel defining layer 106 and a support layer 107 is formed, the first electrode layer 108 covers the second electrode layer 105 as well as the pixel defining layer 106 or the support layer 107.

In the foregoing step, the first insulating layer 101, the second insulating layer 102, the signal transmission layer 103, the planarization layer 104, the second electrode layer 105, the pixel defining layer 106, the support layer 107, and the first electrode layer 108 may be manufactured simultaneously with corresponding layers in the display area A.

The following describes a display panel and a method for manufacturing the same according to an embodiment of the present disclosure with reference to FIGS. 3 to 11. As shown in FIG. 3, the substrate 100 of the display panel includes a display area A, an encapsulation area B surrounding the display area A, and a peripheral area C disposed between the display area A and the encapsulation area B.

The peripheral area C is provided with a first insulating layer 101, a second insulating layer 102, and a signal transmission layer 103 that are laminated on the substrate 100. The signal transmission layer 103 is of a grid structure and has a plurality of third holes 1031.

The peripheral area C is further provided with a planarization layer 104 covering the signal transmission layer 103 and the planarization layer 104 has a plurality of first holes 1041.

The peripheral area C is further provided with a second electrode layer 105 covering the planarization layer 104. The second electrode layer 105 is connected to the signal transmission layer 103 through the first holes 1041 in the planarization layer 104. A second hole 1051 is formed in the second electrode layer 105 on the planarization layer 104.

The peripheral area C is further provided with a pixel defining layer 106 and a support layer 107 that are laminated in the second hole 1051.

Meshes in the grid structure are uniformly distributed. The meshes are squares with sides being 5 micrometers. Widths of the grid lines are 5 micrometers.

The display area A is provided with an active layer 110, a first insulating layer 101, a gate layer 111, a second insulating layer 102, a signal transmission layer 103, a planarization layer 104, a second electrode layer 105, a pixel defining layer 106, a support layer 107, and a first electrode layer 108 that are sequentially laminated on the substrate 100. An organic light-emitting layer (not shown in the figure) is disposed between the second electrode layer 105 and the first electrode layer 108.

The encapsulation area B is provided with a first insulating layer 101, a gate layer 111, a second insulating layer 102, and sealant 112 that are laminated on the substrate 100.

The display panel further includes a cover plate 109. The cover plate 109 is connected to the substrate 100 via the sealant 112.

The method for manufacturing the display panel includes the following steps.

The first insulating layer 101 and the second insulating layer 102 are sequentially formed on the substrate 100 in the peripheral area C, as shown in FIG. 6.

The signal transmission layer 103 is formed by evaporation on the second insulating layer 102.

Third holes 1031 are formed in the signal transmission layer 103 by exposure, etching, and stripping, such that the signal transmission layer 103 forms a grid structure.

The planarization layer 104 is formed on the signal transmission layer 103. The third holes 1031 are filled with the planarization layer 104, as shown in FIG. 7.

A plurality of second holes 1041 are formed in the planarization layer 104 by exposure and curing. The second holes 1041 expose the signal transmission layer 103 under the planarization layer 104.

The second electrode layer 105 is formed by evaporation on the planarization layer 104, as shown in FIG. 8.

The second holes 1051 are formed in the second electrode layer 105 by exposure, etching, and stripping, to expose the planarization layer 104 under the second electrode layer 105.

A pixel defining layer 106 is formed in the second hole 1051, and the structure after the pixel defining layer 106 is formed is as shown in FIG. 9.

A support layer 107 is formed on the pixel defining layer 106. Both the pixel defining layer 106 and the support layer 107 are manufactured by exposure and curing. The structure after the formed support layer 107 is formed is as shown in FIG. 10.

The first electrode layer 108 is formed on the surfaces of the second electrode layer 105, the pixel defining layer 106, and the support layer 107 by evaporation, as shown in FIG. 11.

It should be noted that the order of the steps of the method for manufacturing the display panel according to the embodiments of the present disclosure can be appropriately adjusted. The steps may also be removed or added as required. Within the technical scope of the present disclosure, any variations to the method readily derived by a person skilled in the art shall fall within the protection scope of the present disclosure, and details are not described herein again.

In the foregoing embodiments of the present disclosure, the patterning process is a process of photoresist coating, exposure, development, etching, and stripping.

The foregoing descriptions are merely optional embodiments of the present disclosure and describe the applied technical principles. It is to be understood by persons skilled in the art that the scope of the present disclosure is not limited to the technical solutions formed by specific combinations of the foregoing technical features, and shall further cover other technical solutions formed by any combinations of the foregoing technical features or equivalent features thereof without departing from the foregoing concepts of the present disclosure, for example, technical solutions formed by substitution of technical features with similar functions disclosed by, but are not limited to, the present disclosure for the foregoing features.

What is claimed is:

1. A display panel, comprising:
   a substrate, comprising a display area, an encapsulation area surrounding the display area, and a peripheral area between the display area and the encapsulation area;
   a signal transmission layer disposed in the peripheral area of the substrate, wherein the signal transmission layer is of a grid structure, and the signal transmission layer has a plurality of third holes formed by meshes of the grid structure;
   a protruding structure disposed on the signal transmission layer, wherein the protruding structure comprises a planarization layer covering the signal transmission layer, and the third holes are filled with the planarization layer; and
   a first electrode layer covering the protruding structure, wherein the first electrode layer is electrically connected to the signal transmission layer.

2. The display panel according to claim 1, wherein the planarization layer is provided with a first hole, and the first electrode layer is connected to the signal transmission layer via the first hole.

3. The display panel according to claim 1, wherein the protruding structure further comprises any one of the followings:
   a pixel defining layer disposed on the planarization layer;
   a support layer disposed on the planarization layer; or
   a pixel defining layer and a support layer that are laminated on the planarization layer.

4. The display panel according to claim 3, wherein the peripheral area is further provided with a second electrode layer, wherein the second electrode layer is disposed on the planarization layer, the second electrode layer is at least partially disposed in the first hole, and the second electrode layer is connected to the signal transmission layer, and the first electrode layer covers the second electrode layer.

5. The display panel according to claim 1, wherein the protruding structure comprises a planarization layer, a pixel defining layer and a support layer, wherein
   the planarization layer is covered by a second electrode layer, wherein the second electrode layer is connected to the signal transmission layer via a first hole in the planarization layer, and the second electrode layer has a second hole exposing the planarization layer;
   the pixel defining layer and the support layer are laminated in the second hole; and
   the first electrode layer covers the second electrode layer, the pixel defining layer, and the support layer.

6. The display panel according to claim 1, wherein a ratio of an absolute value of a difference between a height of the peripheral area and a height of the encapsulation area to the height of the encapsulation area is less than or equal to 10%.

7. The display panel according to claim 1, wherein an insulating layer is disposed between the signal transmission layer and the substrate.

8. The display panel according to claim 1, wherein the first electrode layer disposed in the peripheral area is electrically connected to a first electrode layer disposed in the display area.

9. The display panel according to claim 1, wherein the display area is provided with an active layer, a first insulating layer, a gate layer, a second insulating layer, a signal transmission layer, a planarization layer, a second electrode layer, a pixel defining layer, a support layer, and a first electrode layer that are sequentially laminated on the substrate, and an organic light-emitting layer is disposed between the second electrode layer and the first electrode layer.

10. The display panel according to claim 1, wherein the encapsulation area is provided with a first insulating layer, a gate layer, a second insulating layer, and sealant that are laminated on the substrate.

11. A method for manufacturing a display panel; comprising:
    providing a substrate, wherein the substrate comprises a display area, an encapsulation area surrounding the display area, and a peripheral area between the display area and the encapsulation area;
    forming a signal transmission layer in the peripheral area of the substrate, wherein the signal transmission layer is of a grid structure, and the signal transmission layer has a plurality of third holes formed by meshes of the grid structure;
    forming a protruding structure on the signal transmission layer, wherein the protruding structure comprises a planarization layer covering the signal transmission layer; and the third holes are filled with the planarization layer; and
    forming a first electrode layer covering the protruding structure, wherein the first electrode layer is electrically connected to the signal transmission layer.

12. The method according to claim 11, wherein the protruding structure further comprises a pixel defining layer and a support layer, and forming the protruding structure on the signal transmission layer comprises:
    forming the planarization layer on the signal transmission layer, and forming, in the planarization layer, a plurality of first holes exposing the signal transmission layer;
    forming a second electrode layer on the planarization layer, wherein the second electrode layer covers the planarization layer and surfaces of the first holes, and the second electrode layer is connected to the signal transmission layer;
    forming a second hole in the second electrode layer, to expose the planarization layer; and
    sequentially forming the pixel defining layer and the support layer in the second hole.

13. A display device, comprising a display panel, wherein the display panel comprises:

a substrate; comprising a display area, an encapsulation area surrounding the display area, and a peripheral area between the display area and the encapsulation area;

a signal transmission layer disposed in the peripheral area of the substrate, wherein the signal transmission layer is of a grid structure, and the signal transmission layer has a plurality of third holes formed by meshes of the grid structure;

a protruding structure disposed on the signal transmission layer, wherein the protruding structure comprises a planarization layer covering the signal transmission layer, and the third holes are filled with the planarization layer; and a first electrode layer covering the protruding structure, wherein the first electrode layer is electrically connected to the signal transmission layer.

14. The display device according to claim 13, wherein the planarization layer has a first hole, and the first electrode layer is connected to the signal transmission layer via the first hole.

15. The display device according to claim 13, wherein the protruding structure further comprises any one of the followings:

a pixel defining layer disposed on the planarization layer;

a support layer disposed on the planarization layer; or a pixel defining layer and a support layer that are laminated on the planarization layer.

16. The display device according to claim 14, wherein the peripheral area is further provided with a second electrode layer, wherein the second electrode layer is disposed on the planarization layer, the second electrode layer is at least partially disposed in the first hole, and the second electrode layer is connected to the signal transmission layer, and the first electrode layer covers the second electrode layer.

17. The display device according to claim 13, wherein the protruding structure further comprises a pixel defining layer and a support layer;

the planarization layer is covered by a second electrode layer, wherein the second electrode layer is connected to the signal transmission layer via a first hole in the planarization layer, and the second electrode layer has a second hole exposing the planarization layer;

the pixel defining layer and the support layer are laminated in the second hole; and the first electrode layer covers the second electrode layer, the pixel defining layer, and the support layer.

* * * * *

UNITED STATES PATENT AND TRADEMARK OFFICE
CERTIFICATE OF CORRECTION

PATENT NO. : 11,800,740 B2
APPLICATION NO. : 17/345026
DATED : October 24, 2023
INVENTOR(S) : Bai et al.

Page 1 of 1

It is certified that error appears in the above-identified patent and that said Letters Patent is hereby corrected as shown below:

On the Title Page

Item [73], should read:
--ORDOS YUANGSHENG OPOELECTRONICS CO., LTD., Ordos (CN); BOE TECHNOLOGY GROUP CO., LTD., Beijing (CN)--

Signed and Sealed this
Fifth Day of December, 2023

Katherine Kelly Vidal
*Director of the United States Patent and Trademark Office*